(12) United States Patent
Moosburger

(10) Patent No.: US 9,362,258 B2
(45) Date of Patent: Jun. 7, 2016

(54) OPTOELECTRONIC COMPONENT HAVING CHIPS AND CONVERSION ELEMENTS

(71) Applicant: OSRAM Opto Semiconductors GmbH, Regensburg (DE)

(72) Inventor: Jürgen Moosburger, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/430,759

(22) PCT Filed: Sep. 19, 2013

(86) PCT No.: PCT/EP2013/069489
§ 371 (c)(1),
(2) Date: Mar. 24, 2015

(87) PCT Pub. No.: WO2014/048830
PCT Pub. Date: Apr. 3, 2014

(65) Prior Publication Data
US 2015/0255437 A1    Sep. 10, 2015

(30) Foreign Application Priority Data

Sep. 27, 2012    (DE) .................. 10 2012 217 521

(51) Int. Cl.
*H01L 33/58*    (2010.01)
*H01L 33/62*    (2010.01)
(Continued)

(52) U.S. Cl.
CPC ............ *H01L 25/0753* (2013.01); *H01L 24/24* (2013.01); *H01L 25/50* (2013.01); *H01L 33/502* (2013.01); *H01L 33/505* (2013.01); *H01L 33/54* (2013.01); *H01L 33/56* (2013.01); *H01L 33/58* (2013.01); *H01L 33/62* (2013.01); *H01L 2924/0002* (2013.01); *H01L 2924/12041* (2013.01); *H01L 2924/12042* (2013.01);
(Continued)

(58) Field of Classification Search
CPC ..... H01L 25/0753; H01L 33/56; H01L 33/62; H01L 2933/0066; H01L 24/24; H01L 33/502
See application file for complete search history.

(56) References Cited

U.S. PATENT DOCUMENTS 8,900,894 B2    12/2014    Guenther et al.
8,957,428 B2    2/2015    Jagt et al.
(Continued)

FOREIGN PATENT DOCUMENTS

DE    102004050371 A1    4/2006
EP    2216834 A1    8/2010
(Continued)

*Primary Examiner* — Thomas L Dickey
*Assistant Examiner* — Damon Hillman
(74) *Attorney, Agent, or Firm* — Slater Matsil, LLP

(57) ABSTRACT

An optoelectronic component includes a carrier, a first optoelectronic semiconductor chip arranged on the carrier, a first conversion element arranged on the first semiconductor chip, a second optoelectronic semiconductor chip arranged on the carrier and a second conversion element arranged on the second semiconductor chip. The optoelectronic component also includes an insulation material arranged on the carrier. The insulation material surrounds the first and second semiconductor chips and the first and second conversion element. The first conversion element is embodied in a stepped fashion and has a first and a second section wherein the first section projects laterally beyond the second section.

15 Claims, 12 Drawing Sheets

(51) Int. Cl.
*H01L 33/54* (2010.01)
*H01L 25/075* (2006.01)
*H01L 33/50* (2010.01)
*H01L 23/00* (2006.01)
*H01L 25/00* (2006.01)
*H01L 33/56* (2010.01)

(52) U.S. Cl.
CPC ... *H01L2933/005* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 9,024,340 B2 | 5/2015 | Minato et al. |
| 9,196,653 B2 * | 11/2015 | Leatherdale .......... H01L 27/156 |
| 2004/0057114 A1 * | 3/2004 | Hatjasalo ............. G02B 5/1866 359/569 |
| 2006/0138441 A1 * | 6/2006 | Kromotis ............ H01L 25/0753 257/99 |
| 2009/0001490 A1 * | 1/2009 | Bogner ............... H01L 25/0753 257/432 |
| 2009/0108269 A1 | 4/2009 | Negley et al. |
| 2010/0308361 A1 * | 12/2010 | Beeson ................. H05B 33/10 257/98 |
| 2011/0316017 A1 * | 12/2011 | Liu ...................... H01L 33/505 257/91 |

FOREIGN PATENT DOCUMENTS

| | | |
|---|---|---|
| JP | 2012503876 A | 2/2012 |
| WO | 2009069671 A1 | 6/2009 |
| WO | 2010035206 A1 | 4/2010 |

* cited by examiner

OPTOELECTRONIC COMPONENT HAVING CHIPS AND CONVERSION ELEMENTS

This patent application is a national phase filing under section 371 of PCT/EP2013/069489, filed Sep. 19, 2013, which claims the priority of German patent application 10 2012 217 521.0, filed Sep. 27, 2012, each of which is incorporated herein by reference in its entirety.

TECHNICAL FIELD

The invention relates to an optoelectronic component and to a method for producing such a component. The optoelectronic component comprises a carrier, optoelectronic semiconductor chips arranged on the carrier, and conversion elements arranged on the semiconductor chips. Furthermore, an insulation material is arranged on the carrier, said insulation material surrounding the semiconductor chips and the conversion elements.

BACKGROUND

Optoelectronic components are known in various embodiments. What are known as SSL light engines (solid state lighting), which can comprise a plurality of LED chips (light emitting diodes) arranged on a carrier or a circuit board (chip-on-board), are employed for lighting applications. Laminar conversion elements (phosphors) for converting the light radiation emitted by the semiconductor chips can be arranged on the semiconductor chips.

In the context of producing such components, the carrier is usually potted with a white insulation material after the arrangement of the semiconductor chips and conversion elements. This serves to cover metallic areas situated on the carrier. In this way, it is possible to avoid a situation in which a light portion reflected in the direction of the carrier, for example, caused by reflection at a lens of the component, is absorbed at the metallic areas.

During potting, the insulation material is applied in liquid or viscous form to the carrier, and regions between the semiconductor chips and around the latter are filled with the insulation material. In order that in this process the insulation material does not run over the conversion elements and cover the latter, the conversion elements are formed with well-defined edges at the margin of the front sides. The insulation material can be stopped at the front edges on account of the surface tension.

Depending on the light radiation to be generated, an optoelectronic component can be constructed with different conversion elements which convert the light radiation emitted by the semiconductor chips into light radiations having different colors or wavelength ranges. In a manner governed by production, different conversion elements can have different thicknesses. This can have the consequence that, in the case of the semiconductor chips arranged on a carrier, the front sides of the different conversion elements, and thus the edges present here, are situated at different heights in relation to the carrier. During potting with an insulation material the problem can occur, therefore, that the insulation material rises up toward higher front edges of conversion elements but is not stopped by lower edges, and as a result flows over the surfaces of the associated conversion elements that are situated at a lower level. One consequence thereof is a reduced light emission of the component. This problem can occur particularly in the case of relatively closely placed semiconductor chips.

SUMMARY

The present invention is to specifies a solution for an improved optoelectronic component.

In accordance with one aspect of the invention, an optoelectronic component is provided. The optoelectronic component comprises a carrier, a first optoelectronic semiconductor chip arranged on the carrier, a first conversion element arranged on the first semiconductor chip and serving for converting a light radiation emitted by the first semiconductor chip, a second optoelectronic semiconductor chip arranged on the carrier, and a second conversion element arranged on the second semiconductor chip and serving for converting a light radiation emitted by the second semiconductor chip. The optoelectronic component furthermore comprises an insulation material arranged on the carrier, said insulation material surrounding the first and second semiconductor chips and (in part) the first and second conversion elements. The first conversion element is embodied in a stepped fashion and has a first and a second section. The first section projects laterally beyond the second section.

The first conversion element can be arranged on the first semiconductor chip in such a way that the first section is situated opposite the first semiconductor chip. On account of the stepped configuration with the first section projecting laterally beyond the second section, the first conversion element can have laterally at the margin two edges or edge structures present in a manner offset with respect to one another. These are an edge present at the end- or front-side margin of the second section, and a further edge present at the front-side margin of the first section and situated at a lower level. In the context of producing the component, this additional edge of the first conversion element can stop the insulation material applied to the carrier in liquid or viscous form by potting, as a result of which the second conversion element may be prevented from being covered. In particular, a side surface of the second section can be free of the insulation material. The second conversion element can be embodied without a stepped form, and hence with only one edge or edge structure present at the front-side margin.

The stepped form of the first conversion element enables a configuration of the component with a greater distance between the carrier and the front side of the first conversion element than between the carrier and the front side of the second conversion element. In this regard, the additional edge of the first conversion element can be situated at the same or substantially the same height as the front-side edge of the second conversion element. In this way, filling with the insulation material can be stopped at the same or substantially the same height both in the region of the first semiconductor chip and in the region of the second semiconductor chip. The stopping can be effected at the additional edge of the first conversion element in the region of the first semiconductor chip, and at the front edge of the second conversion element in the region of the second semiconductor chip. The insulation material applied to the carrier can therefore surround the semiconductor chips and in part the conversion elements in such a way that no covering of the front side of the second conversion element occurs. Furthermore, the second section of the first conversion element can project completely from the insulation material in sectional view.

The optoelectronic semiconductor chips can be light emitting diode or LED chips, in particular. Furthermore, the first and second semiconductor chips can have the same or identical construction. In this regard, the designation "first" and "second" semiconductor chip relates to the assignment to the associated first and second conversion element. It is also possible, however, for the first and second semiconductor chips to be constructed differently and to have forms and/or structures that deviate from one another.

The optoelectronic component can be embodied in particular with a plurality of first semiconductor chips and first stepped conversion elements arranged thereon and/or a plurality of second semiconductor chips and second conversion elements without a stepped form arranged on said second semiconductor chips. In this case, the additional stopping edge present at first conversion elements, in the context of the potting of the insulation material, in the manner described above, can prevent the front sides of second conversion elements from being covered with the insulation material. It is thereby possible to position the semiconductor chips on the carrier with relatively small spacings, for example, in the range of tens of micrometers, for example, fifty micrometers. As described above, the first and second semiconductor chips can have the same or a corresponding construction, and be designed for emitting a light radiation in the same spectral range. The first and second conversion elements can be formed from different conversion materials in order to convert the light radiation emitted by the semiconductor chips into light radiations in different wavelength ranges.

The configurations described below can be applied in the same way to such a "plural" embodiment of the component.

In a further embodiment, the first and second conversion elements have different thicknesses. The presence of different thicknesses can originate, for example, from production of the conversion elements from different conversion materials. Despite the different thicknesses, the stepped configuration of the first conversion element affords the possibility of reliably preventing a covering of the second conversion element in the manner described above. The conversion elements can thus be embodied and optimized independently of one another, and with regard to predefined optical properties.

The advantageous effect of the stepped form of the first conversion element can be manifested not just when different thicknesses of the conversion elements are present. By way of example (additionally or alternatively) the first and second semiconductor chips can have different thicknesses. For this case, the additional edge of the first conversion element can likewise prevent the second conversion element from being covered with the insulation material.

In a further embodiment, the first section of the first conversion element projects laterally beyond the second section over the entire perimeter of the first conversion element. As a result, the first conversion element can have an edge or edge structure which extends around the entire perimeter and comprises a plurality of edge sections and is suitable for stopping the insulation material. As a result, the front side of the second conversion element can be prevented from being covered with the insulation material with a high reliability.

In a further embodiment, the insulation material is white silicone. This is silicone filled with suitable particles or scattering particles, for example, composed of titanium oxide. Regions between the semiconductor chips and around the semiconductor chips, and hence metallic areas of the carrier that are situated in these regions, can be covered by the white silicone, with the result that absorption of a reflective light portion can be avoided. Instead, said light portion can be reflected back at the white silicone. The use of silicone enables reliable potting of the carrier.

If appropriate, some other reflective insulation or potting material can be employed instead of white silicone. One possible example is an epoxy material which can be filled with suitable particles in the same way.

The insulation material can furthermore serve as a carrier of contact structures for contacting the semiconductor chips. In this regard, in accordance with a further embodiment, provision is made for the first and second semiconductor chips to have in each case at least one front-side contact. In the component, the front-side contacts can be covered by the insulation material. The component furthermore comprises a contact structure arranged on the insulation material and extending to at least one front-side contact. In this case, the contact structure can be partly embedded into the insulation material.

With the aid of such a contact structure, a plurality of which can be present in the component, a front-side contact, for example, can be connected to a contact area of the carrier. In this case, the relevant contact structure extends not only through the insulation material to the front-side contact, but in addition to the contact area. It is also possible for front-side contacts of two semiconductor chips or of the first and second semiconductor chips to be electrically connected to one another with the aid of the contact structure.

In the case where only one front-side contact is present, the first and second semiconductor chips can furthermore each have a rear-side contact. A configuration with two front-side contacts per semiconductor chip is also possible. An electric current can be applied to the semiconductor chips via the contacts, as a result of which the semiconductor chips emit a light radiation. With regard to the front-side contacts, the first and second conversion elements coordinated therewith can have in each case at least one corresponding lateral cutout.

The optoelectronic component can be a white light source, for example. In this regard, in accordance with a further embodiment, provision is made for the first and second semiconductor chips to be designed to generate a light radiation in the blue spectral range. One of the two conversion elements (first or second conversion element) is designed to convert part of the blue light radiation generated by a semiconductor chip into light radiation in the green spectral range. The blue light radiation and the green light radiation together can produce a mint-colored light radiation. The other of the two conversion elements (second or first conversion element) is designed to convert the blue light radiation generated by a semiconductor chip into a light radiation in the red spectral range. The mint-colored light radiation and red light radiation can be superimposed to form a white or warm-white light radiation.

A white light source can be embodied in particular with a plurality of such light emitting units comprising semiconductor chips and conversion elements for generating light radiations having the colors mint and red. In this way, the relevant component can generate a light radiation having a color temperature in the warm-white range and having a high color rendering index (CRI). For this purpose, the different light emitting units can be arranged relatively closely and in a manner suitably distributed on the carrier.

For the optoelectronic component, consideration can furthermore be given to a configuration comprising a (at least one) semiconductor chip whose light radiation is not subjected to conversion. In this regard, in accordance with a further embodiment, provision is made for the optoelectronic component to comprise a further semiconductor chip arranged on the carrier and a radiation-transmissive element arranged on the further semiconductor chip. The radiation-transmissive element serves as a spacer for preventing covering during the potting of the insulation material in this region. For this purpose, the radiation-transmissive element can have, for example, the same thickness as the second conversion element. The further semiconductor chip can have the same or an identical construction with respect to the first and second semiconductor chips. However, a configuration with different forms or structures of semiconductor chips is also possible.

In a further embodiment, the first and second conversion elements are ceramic conversion elements. Efficient heat dissipation during the operation of the optoelectronic component can be made possible in this way. A further possible advantage is that light scattering can be (largely) avoided.

In accordance with a further aspect of the invention a method for producing an optoelectronic component is proposed. The component can be produced according to one of the embodiments described above. The method comprises arranging a first and second optoelectronic semiconductor chip on a carrier, arranging a first conversion element on the first semiconductor chip for converting a light radiation emitted by the first semiconductor chip, and arranging a second conversion element on the second semiconductor chip for converting a light radiation emitted by the second semiconductor chip. Provision is further made for applying an insulation material to the carrier in such a way that the insulation material surrounds the first and second semiconductor chips and the first and second conversion elements. The first conversion element arranged on the first semiconductor chip is embodied in a stepped fashion and has a first and a second section. The first section projects laterally beyond the second section.

By virtue of the stepped configuration with the first section protruding laterally relative to the second section, the first conversion element can have, alongside a front edge situated at the margin of the second section, an additional edge present in a height-offset manner or at a lower level with respect thereto at the front-side margin of the first section. At the additional edge, the insulation material can be stopped during potting carried out in the context of application to the carrier. As a result, it is possible, with the presence of different heights or distances of the front sides of the conversion elements in relation to the carrier, to prevent the front side of the second conversion element from being covered.

The actual process of applying the insulation material to the carrier can be carried out in liquid (viscous) form by potting or filling, as indicated above. This can be followed by drying or curing the insulation material. This can be carried out at a corresponding temperature, for example, 150° C.

The first conversion element can be produced from a starting element by a two-stage structuring method being carried out. In a first stage, the structure of the second section can be formed on or in the starting element. In a subsequent second stage, it is possible to form the structure of the first section and to singulate the entire first conversion element. The individual structuring processes can comprise sawing processes or laser processes, for example.

In a further embodiment, the first and second semiconductor chips have in each case at least one front-side contact. In this case, the front-side contacts are covered by the insulation material applied to the carrier. In order to enable contacting of a front-side contact, a cutout extending to the front-side contact is formed in the insulation material. After the cutout has been formed, a metallic material is applied, with the cutout being filled, to the insulation material in order to form a contact structure.

Embodiments and aspects specified above with regard to the optoelectronic component can come into consideration in the same way for the production method.

BRIEF DESCRIPTION OF THE DRAWINGS

The advantageous embodiments and developments of the invention as explained above and/or represented in the dependent claims can be employed individually or else in arbitrary combination with one another—apart from in cases of clear dependencies or incompatible alternatives, for example.

The above-described properties, features and advantages of this invention and the way in which there are achieved will become clearer and more clearly understood in association with the following description of exemplary embodiments which are explained in greater detail in association with the schematic drawings, in which.

Embodiments of an optoelectronic component and of an associated production method are described on the basis of the following schematic figures. It is pointed out that the figures are not true to scale, and so component parts and structures shown here may be illustrated with an exaggerated size or size reduction in order to afford a better understanding. The components explained comprise a plurality of optoelectronic semiconductor chips and conversion elements arranged thereon and serving for converting a light radiation emitted by the semiconductor chips. The components which can be used for lighting applications, which components can be designated as chip module, SSL light engine or multichip light engine, are designed to the effect of preventing front sides of conversion elements from being covered during potting of an insulation material. The components can be realized in the form of white light sources which emit a white, in particular warm-white, light radiation having a high color rendering index during operation.

In the context of production, processes known from semiconductor technology and from the manufacture of optoelectronic components can be carried out and customary materials can be used, and so they will be discussed only in part. It is furthermore pointed out that besides processes illustrated and described, it is possible, if appropriate, to carry out further method steps for completing a component. In the same way, the components explained can comprise further structures, structure elements and/or layers besides structures shown and described.

DETAILED DESCRIPTION OF ILLUSTRATIVE EMBODIMENTS

The production of a first optoelectronic component 201 is described with reference to FIGS. 1 to 4. Method steps carried out in the method are supplementarily summarized in the flow diagram in FIG. 5, to which reference is likewise made hereinafter.

Figure 1:
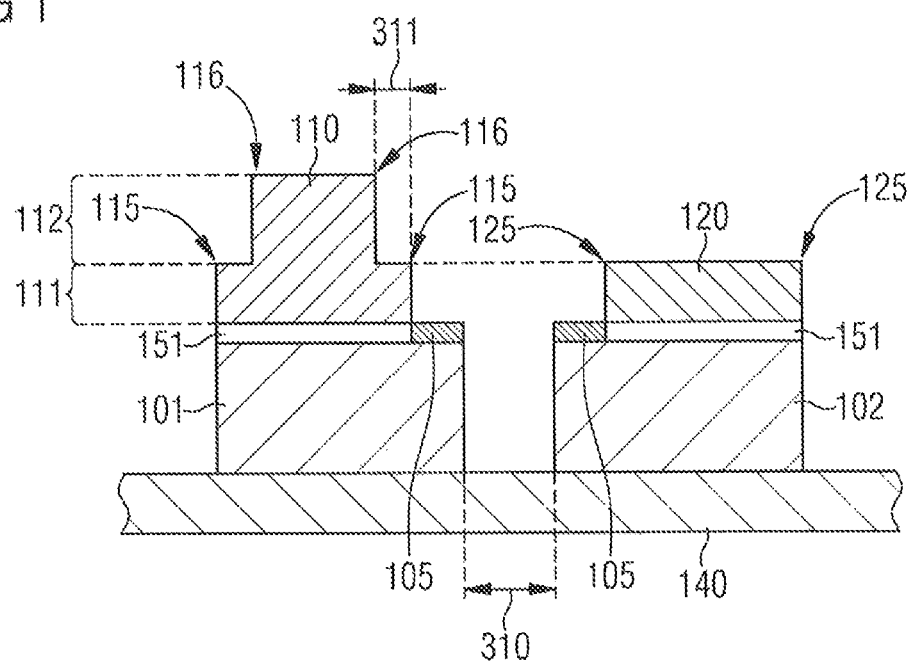
FIGS. 1 to 4 show a method for producing an optoelectronic component comprising optoelectronic semiconductor chips and conversion elements arranged on the semiconductor chips with and without a stepped form, in each case in a schematic lateral illustration.

In the method, a step 301 (see, e.g., FIG. 5) involves firstly providing constituent parts of the component 201 as shown in FIG. 1. They include optoelectronic semiconductor chips 101, 102, conversion elements 110, 120 for arrangement on the semiconductor chips 101, 102, and a carrier 140. Only two semiconductor chips 101, 102 and associated conversion element 110, 120 are illustrated in FIG. 1, and also in the following FIGS. 2 to 4. In order to enable better assignment and differentiation, these component parts are also designated hereinafter as first semiconductor chip 101 and second semiconductor chip 102, and as first conversion element 110 and second conversion element 120.

Figure 16:
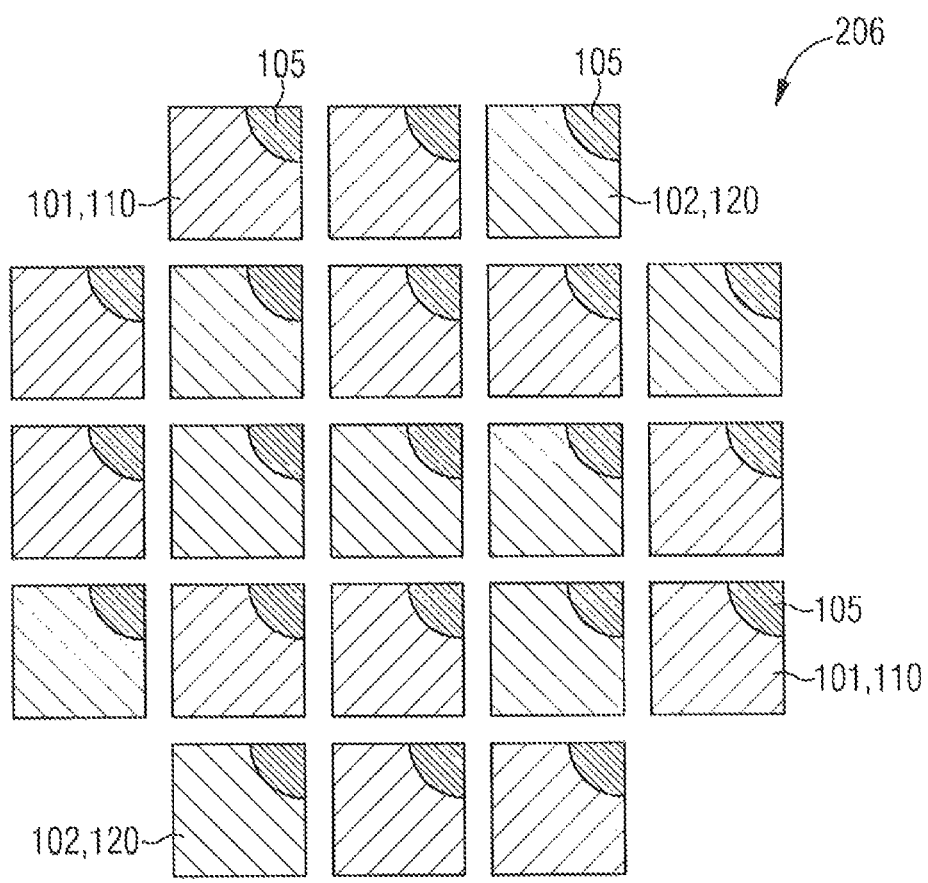
FIG. 16 shows a schematic plan view illustration of an arrangement comprising semiconductor chips and conversion elements of an optoelectronic component.

It is possible for the optoelectronic component 201 to be realized with a plurality of first semiconductor chips 101 and first conversion elements 110 and/or with a plurality of second semiconductor chips 102 and second conversion elements 120 (in this respect, see, e.g., the embodiment shown in FIG. 16). In this regard, FIGS. 1 to 4 may relate merely to a partial excerpt from the component 201 to be produced. The following description with reference to the two semiconductor chips 101, 102 and conversion elements 110, 120 shown may therefore apply in the same way to a "plural" configuration.

The optoelectronic semiconductor chips 101, 102 can be light emitting diode or LED chips, in particular. The semiconductor chips 101, 102 are designed to emit a light radiation during operation when an electric current is applied. With regard to a configuration of the component 201 as a white light source, the semiconductor chips 101, 102 can be designed for emitting a light radiation in the blue wavelength range. For this purpose, the semiconductor chips 101, 102 can comprise, for example, a semiconductor layer sequence based on a III-V compound semiconductor material, for example, InGaN or GaN. It is possible for the semiconductor chips 101, 102 to have the same or a comparable construction and, as indicated in FIG. 1, the same height or thickness.

For applying an electric current, the semiconductor chips 101, 102 shown in FIG. 1 are contactable both at a front side and at a rear side opposite to the front side. In the region of the front side, the semiconductor chips 101, 102 each have a metallic contact 105. The front-side contacts 105, which can be present in the form of contact areas, are arranged at the margin (or at a corner, see, e.g., FIG. 16) of the semiconductor chips 101, 102. Furthermore, the light radiation generated by the semiconductor chips 101, 102 is emitted via the front side (light exit side). At the rear side, the semiconductor chips 101, 102 have metallic rear-side contacts (not illustrated in FIG. 1).

The conversion elements 110, 120 assigned to the semiconductor chips 101, 102 are used for converting the light radiation emitted by the semiconductor chips 101, 102. The conversion elements 110, 120 are designed to convert the primary light radiation emitted by the semiconductor chips 101, 102 via the front sides thereof (in each case) into a secondary light radiation in a different wavelength range. In this case, the spectral ranges of the secondary radiations of the different conversion elements 110, 120 deviate from one another.

With regard to the configuration of the component 201 as a white light source, provision can be made for converting part of the blue primary radiation of the first semiconductor chip 101 into a secondary radiation in the green wavelength range by means of the first conversion element 110 (partial conversion). The blue light radiation and the green light radiation together can produce a mint-colored light radiation. With regard to the second semiconductor chip 102, provision can be made for the second conversion element 120 to convert substantially the entire blue primary radiation into a secondary light radiation in the red wavelength range (full conversion). The mint-colored light radiation and the red light radiation, particularly with the presence of a plurality of light emitting units comprising semiconductor chips 101 and conversion elements 110 and light emitting units comprising semiconductor chips 102 and conversion elements 120, can be superimposed to form a white or warm-white light radiation. An opposite configuration is also possible, that is to say that the first conversion element 110 is designed for generating a red light radiation and the second conversion element 120 is designed for generating a green light radiation.

The conversion elements 110, 120 that convert the primary radiation of the semiconductor chips 101, 102 into different secondary radiations are constructed from different materials. In a manner governed by the production, in particular with regard to optimum production of the respective conversion elements 110, 120, this can result in a presence of different thicknesses of the conversion elements 110, 120. As is shown in FIG. 1, the first conversion element 110 has a greater thickness than the second conversion element 120. The thicknesses of the conversion elements 110, 120 can be, for example, in the range of from tens to hundreds of micrometers.

In order, despite the different thicknesses, to prevent the thinner second conversion element 120 from being covered by an insulation material 150 applied in a later method stage, the thicker first conversion element 110 is embodied in a stepped fashion in cross section. As shown in FIG. 1, the first conversion element 110 has a first section 111 and a second section 112 having smaller lateral dimensions compared with the first section 111. In this way, the first section 111, by which the first conversion element 110 is connected to the first semiconductor chip 101, projects laterally beyond the second section 112. In the later process of applying the insulation material, a side surface of the second section remains free of the insulation material.

In this way, the first conversion element 110 has an edge structure 116 present at the front-side margin of the second section 112 and, in an offset manner or at a lower level with respect thereto, an edge structure 115 present at the front-side margin of the first section 111. The stepped configuration of the first conversion element 110 having the first or lower section 111 projecting laterally beyond the second or upper section 112 is present over the entire perimeter of the first conversion element 110. As a result, the two edge structures 115, 116 in each case extend around the entire perimeter of the stepped conversion element 110.

Figure 17:
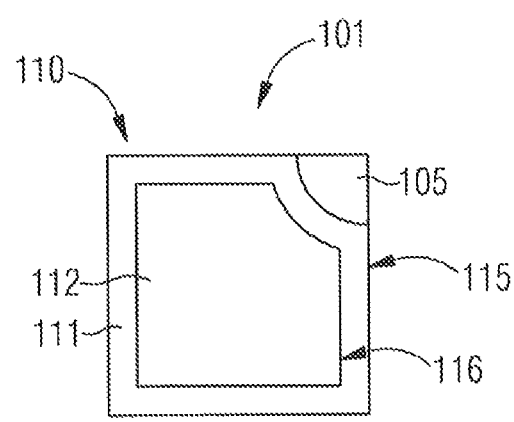
FIG. 17 shows a schematic plan view illustration of an optoelectronic semiconductor chip with a stepped conversion element arranged on the semiconductor chip.

The two edge structures 115, 116, as viewed from above, can be composed of a plurality of edge sections adjoining one another (see, e.g., the embodiment shown in FIG. 17 having four straight sections and one curved section per edge structure 115, 116). In this case, the edge structure 116 is offset laterally inward relative to the edge structure 115. With reference to FIG. 1 it becomes clear that the first conversion element 110 has in each case a right-angled cross-sectional form in the region of the two edge structures 115, 116.

By contrast, the second conversion element 120 used on the second semiconductor chip 102 has (in cross section) no stepped form. Therefore, the second conversion element has on the front side at the margin only one edge structure 125 extending around the perimeter, which, as viewed from above, can likewise be composed of a plurality of edge sections adjoining one another (see, e.g., FIG. 16). As shown in FIG. 1, a right-angled cross-sectional form is likewise present in the region of the edge structure 125. The edge structures 115, 116, 125 of the first and second conversion elements 110, 120 are also designated hereinafter in an abbreviated form just by the expression "edge".

The conversion elements 110, 120 can be ceramic conversion elements, for example. The advantage of efficient heat dissipation during the operation of the optoelectronic component 201 can be made possible in this way. A further advantage is that no or only relatively little light scattering occurs. The production of the conversion elements 110, 120 present in ceramic form can comprise sintering a conversion material initially present in powder form.

For the conversion of a blue light radiation into a green light radiation, a cerium-doped garnet, for example, YAG (yttrium aluminum garnet) or LuAG (lutetium aluminum garnet), can be used, for example, as conversion material. LuYAG with mixing ratios between yttrium and lutetium is also possible. Optionally, the admixture of gallium or gadolinium is possible, and aluminum can be replaced by magnesium. Furthermore, a doping with europium can be provided instead of cerium. Further materials to which consideration is given include SrSiON or BaSiON, in each case doped with europium.

For the conversion of a blue light radiation into a red light radiation, europium-doped CaAlSiN can be used, for example. Furthermore, the use of europium-doped (EA) 2Si5N8, for example, is possible, wherein EA stands for an alkaline earth metal such as, for example, Sr, Ba, Ca or mixtures thereof.

For the green conversion, a thickness or layer thickness of a ceramic conversion element can be, for example, in the range of between 30 and 600 micrometers. For the red conversion, a thickness in the range of between 30 and 300 micrometers, for example, can be present.

Alternatively, other embodiments can also be considered for the conversion elements 110, 120. By way of example, it is possible to form the conversion elements 110, 120 from silicone, wherein the silicone is filled with particles of a conversion material. The particles can be formed from the conversion materials indicated above, for example. Conversion elements formed from particle-filled silicone can have thicknesses in the range of, for example, 20 to 300 micrometers, for example, 30 to 80 micrometers.

The carrier 140 provided for carrying the semiconductor chips 101, 102 can be embodied with connection or contact structures (not illustrated) for the semiconductor chips 101, 102. By way of example, the carrier 140 can comprise metallic mating contacts coordinated with rear-side contacts of the semiconductor chips 101, 102. The carrier 140 can furthermore be embodied, for example, in the form of a ceramic carrier. Alternatively, some other configuration can be considered. By way of example, the carrier 140 can have a metallic heat sink (not illustrated), wherein the heat sink, and in part corresponding connection or contact structures, are surrounded by a plastic material (premold carrier).

Providing (step 301) is followed by assembling the individual constituent parts of the component 201 to be produced in accordance with the arranged shown in FIG. 1, in a further step 302. In this case, the semiconductor chips 101, 102 are arranged on the carrier 140, and the conversion elements 110, 120 are arranged on the semiconductor chips 101, 102. In this case, it is possible to carry out first the process of arranging the chips 101, 102 on the carrier 140, followed by the process of arranging the conversion elements 110, 120 on the chips 101, 102.

Arranging the semiconductor chips 101, 102 on the carrier 140 can be effected, for example, by means of soldering using a solder. In this way, the rear-side contacts of the semiconductor chips 101, 102 and mating contacts of the carrier 140 can be electrically and mechanically connected.

As shown in FIG. 1, the semiconductor chips 101, 102 are arranged at a distance 310 from one another on the carrier 140. The distance 310 can be relatively small, and can be fifty micrometers, for example. With regard to a "plural" configuration of the component 201, the same distance 310 can be present between all the semiconductor chips 101, 102 in a corresponding fashion, and said semiconductor chips can be arranged in a suitably distributed manner on the carrier 140 (see, e.g., the embodiment in FIG. 16).

The semiconductor chips 101, 102 can furthermore be arranged on the carrier 140 with a corresponding orientation coordinated with an electrical contacting of the chips 101, 102 that is produced in a later method stage. In the case of the two semiconductor chips 101, 102 shown in FIG. 1, provision is made for the front-side contacts 105 to be electrically connected to one another. For this purpose, as illustrated in FIG. 1, the semiconductor chips 101, 102 can face one another with the chip regions or chip sides having the contacts 105. However, other chip orientations are also possible.

As shown in FIG. 1, the conversion elements 110, 120 are connected to the semiconductor chips 101, 102 using a transparent adhesive 151. By way of example, the use of a silicone adhesive is appropriate as adhesive 151. The conversion elements 110, 120 are positioned on the semiconductor chips 101, 102 or on the front sides thereof in such a way that the front-side contacts 105 are exposed. In this regard, the conversion elements 110, 120 have a form coordinated with the semiconductor chips 101, 102 with a cutout present at the margin. The conversion elements 110, 120 can have, in particular, as viewed from above, a substantially rectangular or square basic form with a cutout at the corner (see, e.g., FIG. 16). With regard to the stepped first conversion element 110, its two sections 111, 112 have a comparable contour (i.e., having such a cutout), such that the stepped form as described above can be present over the entire perimeter of the first conversion element 110 (see, e.g., FIG. 17).

The semiconductor chips 101, 102 applied to the carrier 140 and the conversion elements 110, 120 arranged on said semiconductor chips are coordinated with one another in such a way that the additional edge 115 of the first conversion element 110, as is indicated with the aid of a dashed line in FIG. 1, relative to the carrier 140, can be at the same or substantially the same height as the front-side edge 125 of the second conversion element 120. If appropriate, in a manner governed by tolerances, a small height offset may be present, for example, in the range of a few micrometers (for example, ten micrometers).

Figure 2:
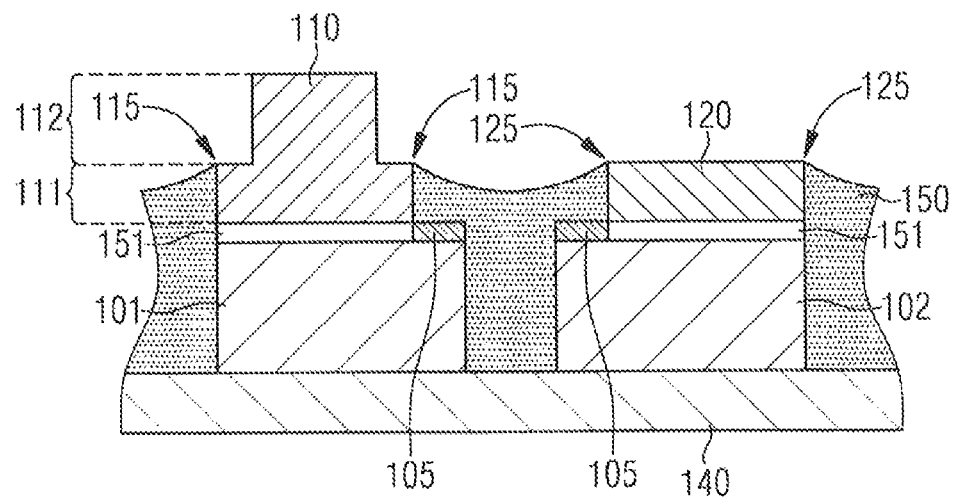

The matching edge height is utilized in a subsequent method step 303 (see, e.g., FIG. 5), in which, as shown in FIG. 2, a white insulation material 150 is applied to the carrier 140, which insulation material encloses the semiconductor chips 101, 102 and in part the conversion elements 110, 120. The insulation material 150 is used to fill regions between the semiconductor chips 101, 102 and around the semiconductor chips 101, 102, as a result of which metallic structures or areas of the carrier 140 possibly situated in said regions can be covered. In this way, it is possible to avoid a situation where a light portion reflected in the direction of the carrier 140, for example, caused by a reflection at a lens of the component 201, is absorbed at the metallic areas. Said light portion can be reflected back at the white insulation material 150.

The white insulation material 150, which is applied in liquid or viscous form to the carrier 140 and is subsequently cured or dried at a temperature of 150° C., for example, can be white silicone, in particular. This involves silicone filled with suitable particles composed of titanium oxide or aluminum oxide, for example.

The process of potting the carrier 140 with the liquid (viscous) insulation material 150 is carried out in such a way that the insulation material 150, as shown in FIG. 2, is filled to a level above the semiconductor chips 101, 102 (or the front sides thereof), and the front-side contacts 105 are consequently covered by the insulation material 150. This is chosen with regard to the electrical contacting of the semiconductor chips 101, 102 which is produced in a later method stage and which is formed on and partly in embedded form in the insulation material 150.

On account of the stepped form of the first conversion element 110, the process of filling with the insulation material 150 can be carried out in such a way that the insulation material 150 has the same or substantially the same thickness in the region of both semiconductor chips 101, 102. By virtue of the edges 115, 125 of the first and second conversion elements 110, 120 situated at the same or substantially the same level, it is possible for the insulation material 150 to rise toward both edges 115, 125 and to be stopped at the edges 115, 125 on account of the surface tension of the insulation material 150. In this way, it is possible to prevent the insulation material 150 from flowing over the second conversion element 120 and covering the front side thereof during the process of potting the carrier 140. The filled insulation material 150, which surrounds the perimeter of the semiconductor chips 101, 102 and the conversion elements 110, 120, can have a curved surface, also designated as meniscus, as indicated in FIG. 2. The "symmetrical" potting that can be obtained with the stepped form occurs in the same way during production of the component 201 with a plurality of light emitting units 101, 110 and 102, 120.

A use of different conversion elements without provision of such a stepped form, wherein front sides and thus front edges of conversion elements are at different levels, can result, by contrast, in a covering of a front side situated at a lower level. In this case, a rising of an insulation material used up to a front side (or front edge) situated at a higher level can result in a formation of an asymmetrical surface curvature in the insulation material between the relevant chips, and thus in the insulation material running over the lower front side. As a result, the front side can be partly or completely covered with the insulation material. This results in a reduced light emission of the relevant component.

In order to be able to reliably stop the insulation material 150 at the additional stop edge 115 of the first conversion element 110, the lateral projection of the first section 111 relative to the second section 112 has a suitable lateral depth 311 in cross section (see, e.g., FIG. 1). The depth 311 can be in the range of ten micrometers or more, for example.

Besides the covering function, the white insulation material 150 is furthermore used for carrying or embedding structures 160 for electrically contacting the semiconductor chips 101, 102. The production of such structures 160, which is illustrated in the case of the component 201 shown on the basis of an individual contact structure 160 connecting the front-side contacts 105 of the two semiconductor chips 101, 102 shown, is carried out in the context of a further step 304 (see, e.g., FIG. 5). This can involve a so-called CPHF metallization (Compact Planar High Flux).

Figure 3:
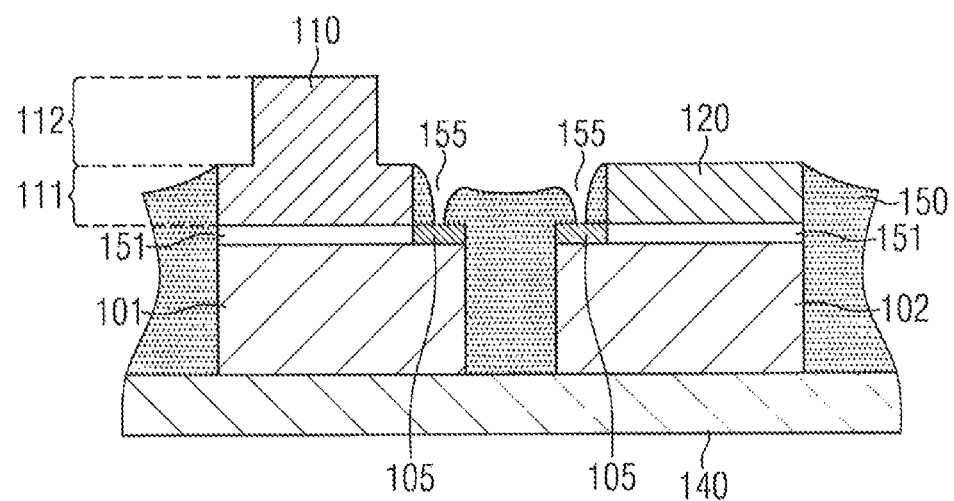
Figure 4:
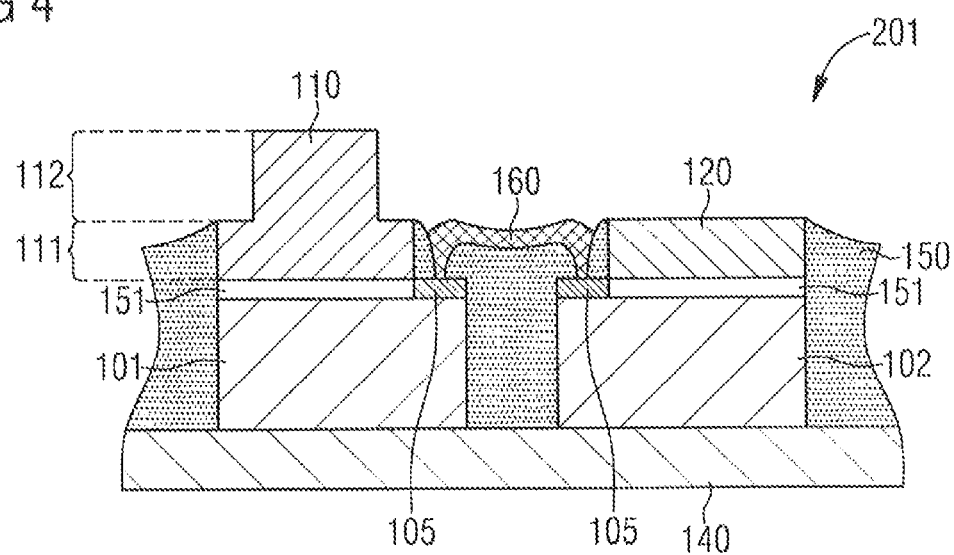
Figure 5:
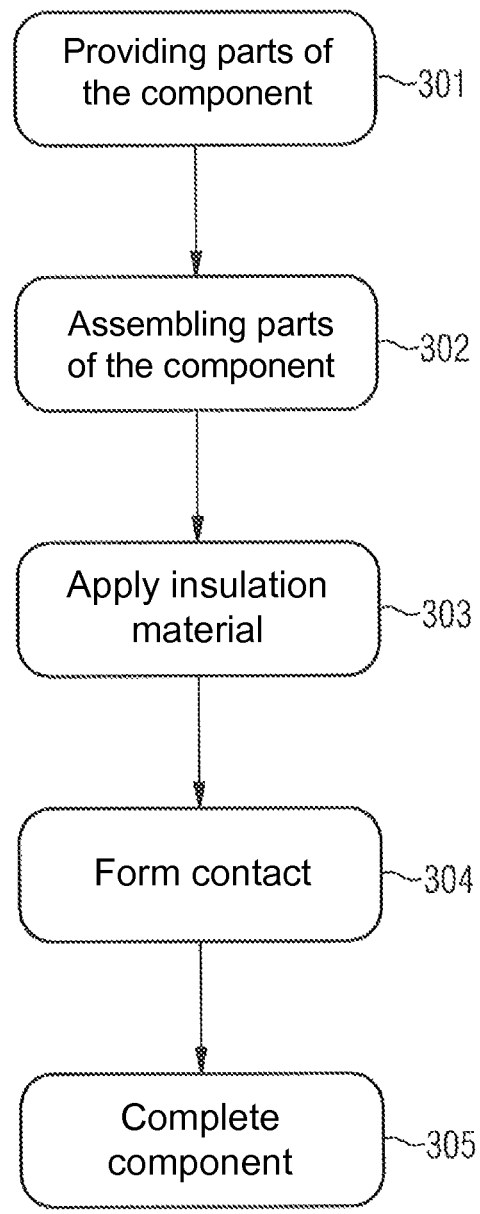
FIG. 5 shows an associated flow diagram of a method for producing an optoelectronic component.

Step 304 involves firstly, as shown in FIG. 3, forming cutouts 155 in the cured insulation material 150, which cutouts extend to the front-side contacts 105 of the chips 101, 102 or partly expose the front-side contacts 105. For this purpose, a laser can be used, for example, whereby the insulation material 150 can be removed relatively accurately. This is followed by applying a metallic material, with the cutouts 155 being filled, to the insulation material 150 and the exposed locations of the front-side contacts 105, such that a contact structure 160 connecting the front-side contacts 105 is formed, as shown in FIG. 4.

The metallization can comprise, for example, carrying out an electroplating method. In this case, provision can be made for applying a seed layer over a large area onto the insulation material 150, the exposed partial regions of the front-side contacts 105 and the conversion elements 110, 120, for masking the seed layer by means of a photoresist, for example, in order to define the (lateral) form of the contact structure 160 to be produced, and for subsequently depositing a metal electrochemically. In this case, the deposition takes place only at non-masked locations on the seed layer. Afterward, the masking can be removed and the seed layer outside the relevant contact structure 160 can be removed by etching. Copper, for example, can be taken into consideration as material for the seed layer and the deposited metal.

In the case of a plurality of semiconductor chips 101, 102, in the context of step 304, a plurality of contact structures 160 for contacting front-side contacts 105 of semiconductor chips 101, 102 can be produced jointly in accordance with the approach described above. In this case, the lateral form of such contact structures 160 can be dependent on the respective orientation of the semiconductor chips 101, 102. In the case of the component 201 from FIG. 4 with the chip regions facing one another and having the front-side contacts 105, the contact structure 160 shown can have, for example, a straight line form in plane view. In a departure therefrom, other forms are possible, such as, for example, a structure running (partly) around a chip in plan view.

Furthermore, with a contact structure 160, front-side contacts of two first semiconductor chips 101 or of two second semiconductor chips 102 can also be electrically connected. Furthermore, it is possible to form a contact structure 160 via which a front-side contact 105 of a semiconductor chip 101, 102 is connected to a contact of the carrier 140 (see, e.g., FIG. 10). In this case, before the metallization process, a cutout extending to the contact of the carrier 140 is formed in the insulation material 150.

After the contact structures 160 have been formed, it is possible to carry out further processes (not illustrated) for completing the optoelectronic component 201 in FIG. 4. Such steps are combined in a further step 305 in the flow diagram in FIG. 5. They include, for example, a (further) process of potting the component 201, a process of arranging a lens, a process of arranging or forming a mixing element for mixing the different light radiations (mint and red), etc.

Figure 6:
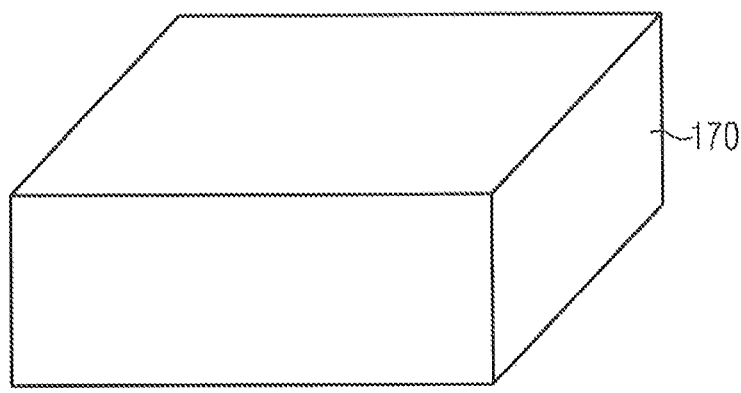
FIGS. 6 to 8 show a method for producing stepped conversion elements, in each case in a schematic perspective illustration.

The process of providing a stepped conversion element 110 that is carried out in the context of step 301 can be effected on the basis of a two-stage structuring method. This is described in greater detail below with reference to FIGS. 6 to 8, which illustrate production as excerpt in perspective form. In this case, firstly, as is shown in FIG. 6, a plate-shaped starting element 170 is provided. The starting element 170 is formed from the same material as a conversion element 110 to be produced (ceramic or particle-filled silicone). In particular, a plurality of conversion elements 110 can be produced from the starting element 170.

Figure 7:
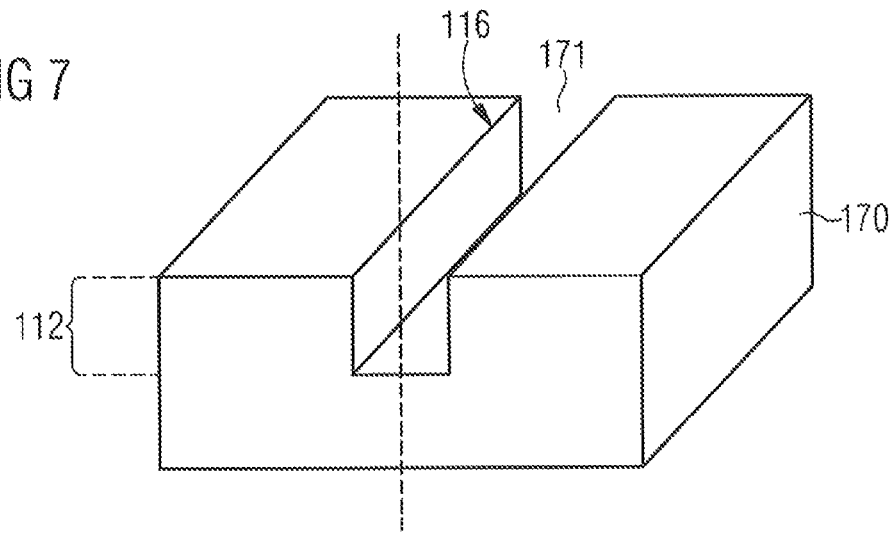

As is indicated as an excerpt in FIG. 7, in a first structuring step, a depression structure 171 is formed in the starting element 170. The depression structure 171 serves to predefine the contour of the second section 112 (and thus also of the front edge 116) of a conversion element 110, and has for this purpose a form coordinated with the second section 112 or a form extending around a second section 112 (not illustrated). For the production of a plurality of conversion elements 110 from the starting element 170, the depression structure 171 is present as a continuous structure which extends around a plurality of second sections 112 and therefore separates them from one another, as is indicated with the aid of the dashed line in FIG. 7.

In the case where a ceramic starting element 170 is present, the depression structure 171 can be formed by a sawing process, for example. In this case, the starting element 170 can be scribed using a relatively thick saw blade. In the case of a starting element 170 composed of particle-filled silicone, a laser can be employed instead.

Figure 8:
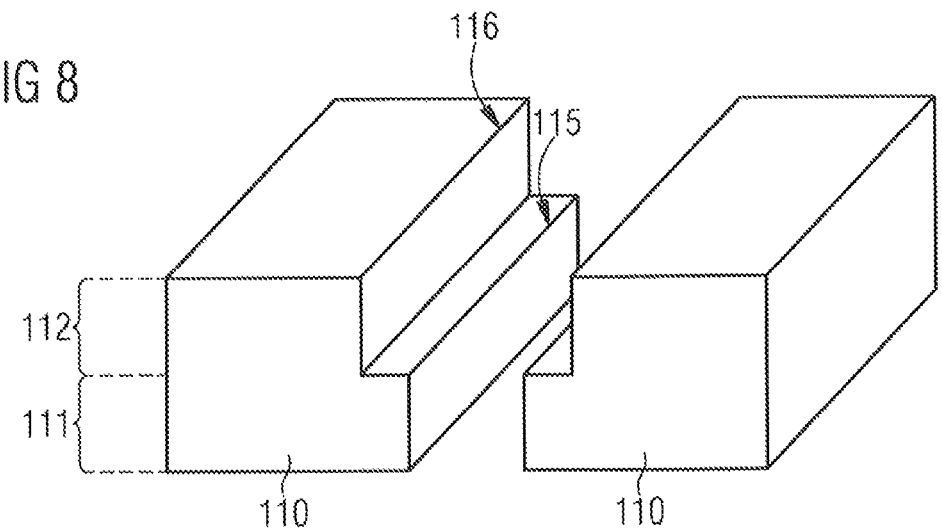

This is followed by carrying out a second structuring step, in which, as indicated as an excerpt in FIG. 8, final severing of the starting element 170 and thus production of a plurality of singulated conversion elements 110 can take place. This step furthermore involves defining the contour of the first section 111 (and thus also of the peripherally extending stop edge 115) of one conversion element 110 or the conversion elements 110. In the case of a ceramic starting element 170, it is again possible to carry out a sawing process, here using a relatively thin saw blade. In the case of a starting element 170 composed of particle-filled silicone, the severing can be effected with the aid of a laser.

With reference to the following figures, a description is given of embodiments of further optoelectronic components. These are embodied on the basis of the approaches described above, and have in the same way stepped conversion elements 110 and conversion elements 120 without a stepped form. It is pointed out that with regard to already described details relating to identical or corresponding component parts and features, possible advantages, possible steps for production, etc., reference is made to the explanations above. Furthermore, it is possible that features and aspects mentioned with regard to one of the following embodiments can also be applied to other embodiments from among those described below, or can be applied to the component 201 from FIG. 4.

Figure 9:
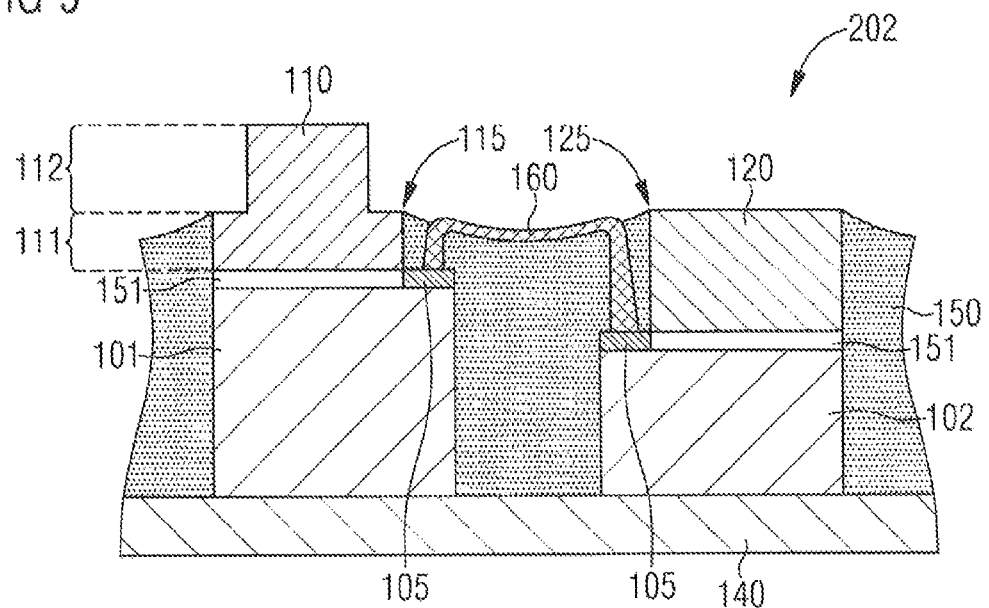
FIG. 9 shows a schematic lateral illustration of an optoelectronic component comprising semiconductor chips having different thicknesses.

The advantageous effect of stepped conversion elements 110 can be utilized not just with the presence of conversion elements 110, 120 having different thicknesses. For illustration purposes, FIG. 9 shows an excerpt from a further optoelectronic component 202, in which not just the conversion elements 110, 120 but additionally also the optoelectronic semiconductor chips 101, 102 used have different thicknesses. This can originate from a different construction of the semiconductor chips 101, 102 used. The form of the first conversion element 110 is coordinated therewith, such that the additional edge 115 is again situated at the same or substantially the same level as the front edge 125 of the second conversion element 120. As a result, the front side of the second conversion element 120 can be prevented from being covered during the process of filling the insulation material 150.

This advantage can be obtained analogously in such an embodiment in which only the individual semiconductor chips 101, 102 have different thicknesses, whereas the associated conversion elements 110, 120, once again embodied with and without a stepped form, have matching thicknesses (not illustrated).

An optoelectronic component can be constructed in such a way that a plurality or all of the semiconductor chips 101, 102 are electrically connected to one another in the form of a series connection. Possible embodiments in this respect are described in greater detail below.

Figure 10:
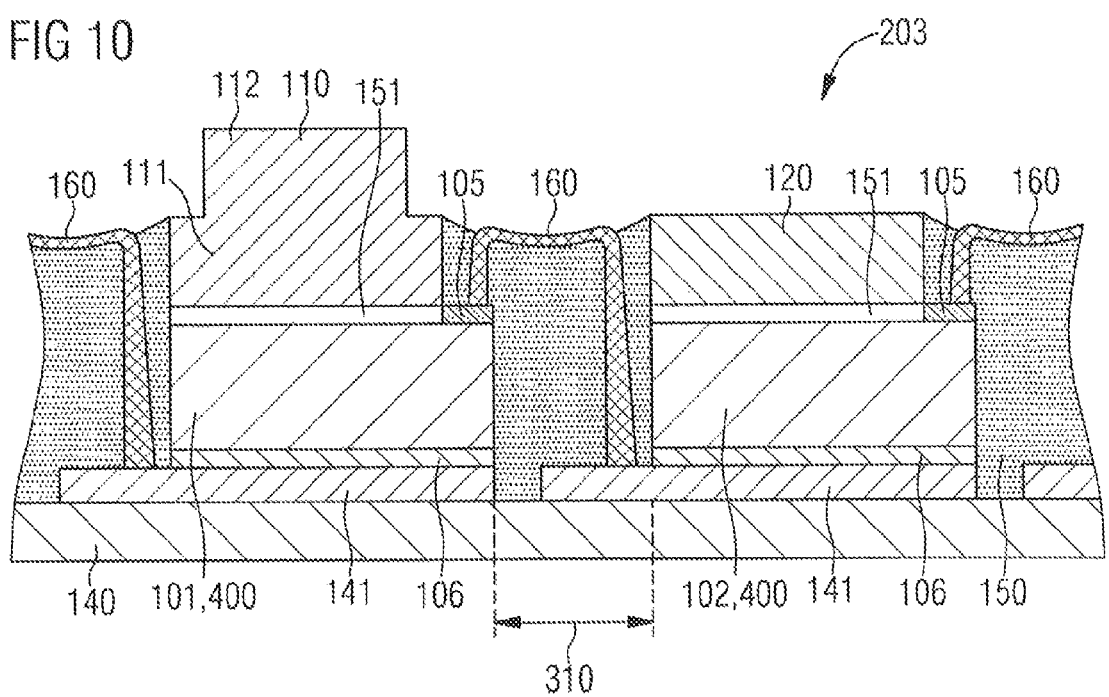
FIG. 10 shows a schematic lateral illustration of an optoelectronic component in which front- and rear-side contacts of semiconductor chips are electrically connected.

FIG. 10 shows an excerpt from a further optoelectronic component 203 comprising series-connected optoelectronic semiconductor chips 101, 102 and conversion elements 110, 120 arranged thereon with and without a stepped form. The semiconductor chips 101, 102 have in each case a metallic front-side contact 105 and in each case a metallic rear-side contact 106. Furthermore, the (at least two shown) semiconductor chips 101, 102 can be oriented in the same direction with the chip regions having the contacts 105. The associated carrier 140 of the component 203 is embodied with mating contacts in the form of metallic contact areas 141 for the rear-side contacts 106. In the case of the semiconductor chips 101, 102 arranged thereon, a connection between the rear-side contacts 106 and the contact areas 141 can be produced by means of a solder, for example.

As is furthermore illustrated in FIG. 10, the component 203 furthermore comprises a contact structure 160, which is arranged on the insulation material 150 and is partly embedded into the insulation material 150 and connects the front-side contact 105 of the first semiconductor chip 101 shown to that contact area 141 of the carrier 140 on which the second semiconductor chip 102 shown is arranged. A comparable electrical connection can be formed with respect to further semiconductor chips 101, 102 (not illustrated), as is indicated in FIG. 10 on the basis of further contact structures 160 partly shown.

For the electrical connection, the contact areas 141 of the carrier 140 are formed with larger lateral dimensions than the semiconductor chips 101, 102. As a result, the semiconductor chips 101, 102, as shown in FIG. 10, can be positioned on the contact areas 141 in such a way that a partial region of the contact areas 141, which partial region projects laterally relative to the semiconductor chips 101, 102, is available for connecting the contact structures 160. In the process of forming the contact structures 160, before the metallization process, cutouts extending to said partial regions of the contact areas 141 are formed in the insulation material 150.

A distance 310 present between the semiconductor chips 101, 102 is furthermore indicated in FIG. 10. The envisaged contacting of the contact areas 141 of the carrier 140 via the contact structures 160 can result in a somewhat greater chip distance 310, for example, of 250 micrometers or more.

The electrical series connection shown in FIG. 10 can be present not just alternately in each case between a first and second semiconductor chip 101, 102. It is also possible to connect a plurality of first semiconductor chips 101 with stepped conversion elements 110 and a plurality of second semiconductor chips 102 with conversion elements 120 without a stepped form in the manner illustrated.

Figure 11:
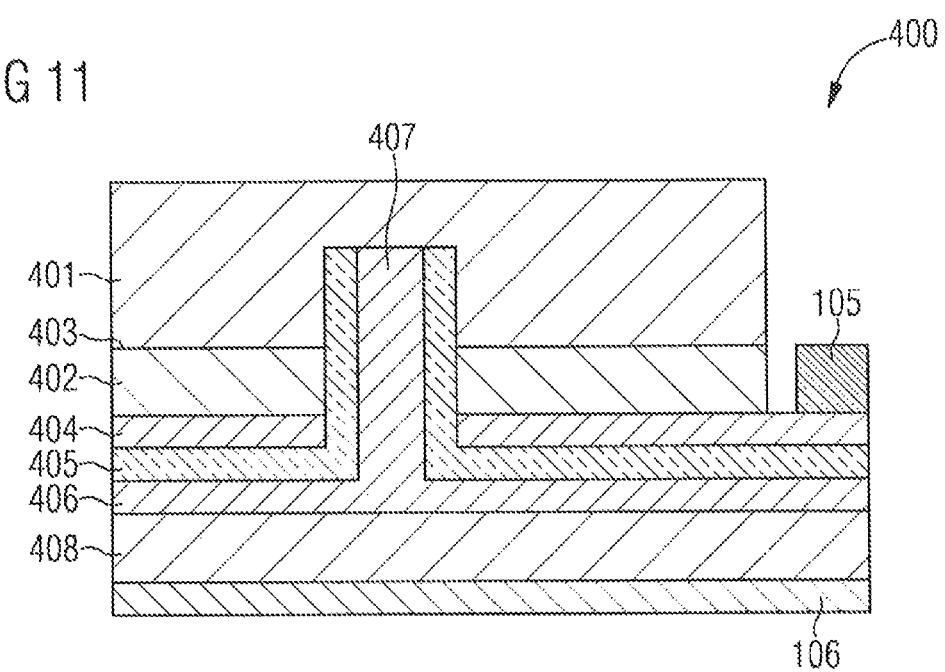
FIG. 11 shows a schematic lateral illustration of an optoelectronic semiconductor chip having a front-side contact, a rear-side contact and a plated-through hole.

FIG. 11 shows a schematic lateral illustration of one possible embodiment of a semiconductor or LED chip 400, which can come into consideration in particular for the semiconductor chips 101, 102 of the component 203 shown in FIG. 10. The semiconductor chip 400 in FIG. 11 has a semiconductor body with a layer sequence comprising a first semiconductor layer 401, a second semiconductor layer 402 and, present therebetween, an active zone 403 for generating radiation. The two semiconductor layers 401, 402 have different conductivities or dopings. The semiconductor body is arranged on a conductive current spreading layer 404, on which a metallic front-side contact 105 is arranged laterally with respect to the semiconductor body. The current spreading layer 404 enables a uniform current flow. A conversion element (not illustrated) can be adhesively bonded at the front side onto the semiconductor body or onto the semiconductor layer 401.

The semiconductor chip 400 furthermore has a through contact 407. A cutout extending vertically through the current spreading layer 404, the semiconductor layer 402, the active zone 403, and into the semiconductor layer 401 is formed for the through contact 407, said cutout being filled at the margin with an insulation layer 405 and with a conductive layer 406 surrounded by the insulation layer 405. The conductive layer 406 makes contact with the semiconductor layer 401. Outside the through contact 407, the current spreading layer 404, the insulation layer 405 and the conductive layer 406 are arranged one above another in the form of a layer stack. The conductive layer 406 is furthermore arranged on a conductive carrier substrate 408, on which a metallic rear-side contact 406 is arranged at the rear side. A connection between the conductive layer 406 and the carrier substrate 408 can be produced by means of a connection layer (not illustrated). The semiconductor chip 400 can be embodied with a plurality of such through contacts 407.

In the case of the semiconductor chip 400, the front-side contact 105 is electrically connected to the second semiconductor layer 402 via the current spreading layer 404. The rear-side contact 106 is electrically connected to the first semiconductor layer 401 via the carrier substrate 408, the conductive layer 406 and the through contact(s) 407. By way of example, the second semiconductor layer 402 can be p-conducting, such that the front-side contact 105 constitutes a p-type contact. By contrast, the other semiconductor layer 401 can be n-conducting, such that the rear-side contact 106 constitutes an n-type contact. With regard to the component 203 from FIG. 10, in this respect a p-type contact 105 can be connected to an n-type contact 106 via a contact structure 160 and a contact area 141.

Figure 12:
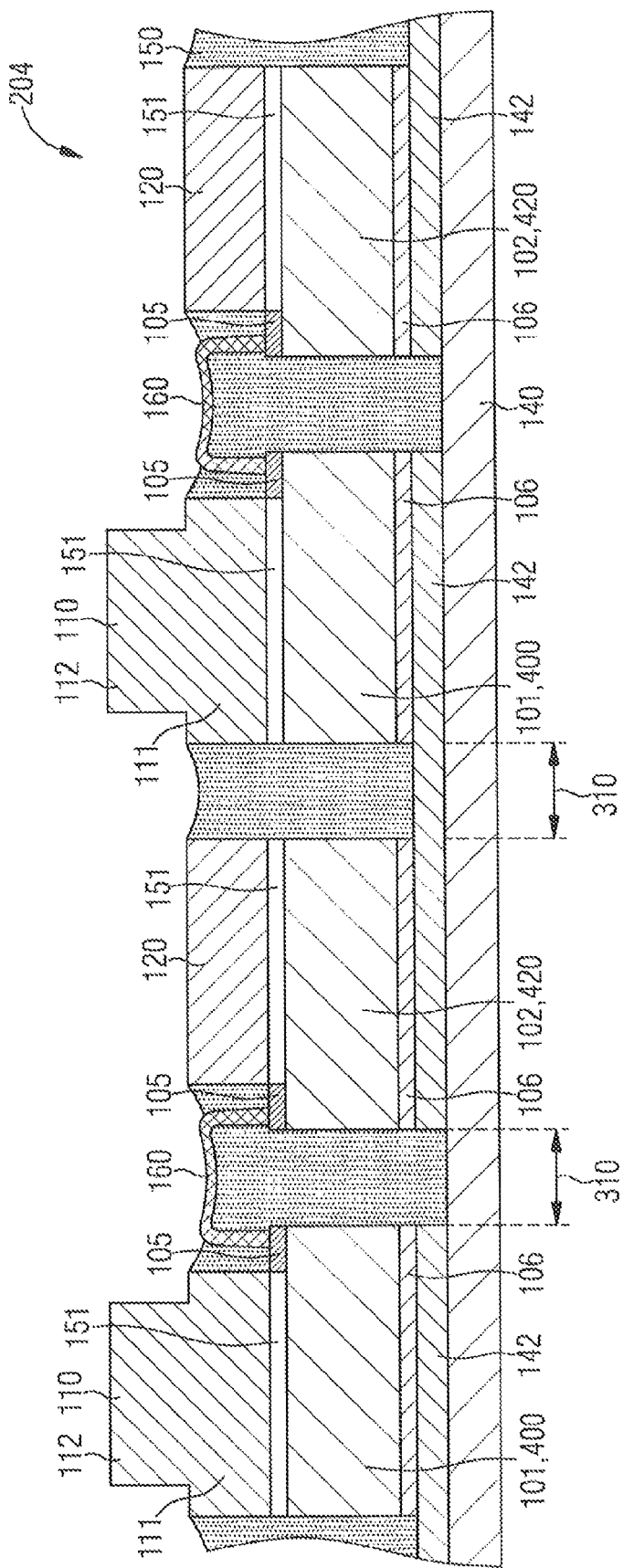
FIG. 12 shows a schematic lateral illustration of an optoelectronic component in which in an alternating manner respective front-side contacts and respective rear-side contacts of semiconductor chips are electrically connected.

FIG. 12 shows an excerpt from a further optoelectronic component 204 comprising series-connected optoelectronic semiconductor chips 101, 102 and conversion elements 110, 120 arranged thereon. The semiconductor chips 101, 102 have in each case a metallic front-side contact 105 and in each case a metallic rear-side contact 106. In the case of the component 204, in an alternating manner, respective front-side contacts 105 and respective rear-side contacts 106 of first and second semiconductor chips 101, 102 are electrically connected. For this purpose, the carrier 140 is embodied with relatively large metallic contact areas 142. In each case a first and second semiconductor chip 101, 102 are arranged on the contact areas 142. A connection between the rear-side contacts 106 and the contact areas 142 can again be produced by means of a solder, for example.

In the case of the semiconductor chips 101, 102 arranged on a common contact area 142, the rear-side contacts 106 are electrically connected via the contact area 142. Electrical connections to other semiconductor chips 101, 102 positioned jointly on a contact area 142 are produced via contact structures 160. Respective front-side contacts 105 of a first and second semiconductor chip 101, 102 are electrically connected in this case. At least the semiconductor chips 101, 102 shown in FIG. 12 can in this case face one another with the chip regions having the contacts 105. The contact structures 160 are arranged on the insulation material 150 and partly embedded into the insulation material 150, and therefore extend to the relevant front-side contacts 105. The electrical connection illustrated can be continued toward further semiconductor chips 101, 102 (not illustrated).

Distances 310 present between the semiconductor chips 101, 102 are furthermore indicated in FIG. 12. The distances 310 can be relatively small, and can be fifty micrometers, for example. The electrical series connection shown in FIG. 12 can be present not just alternately in each case between a first and second semiconductor chip 101, 102. A modification is also possible in such a way that a plurality of first semiconductor chips 101 with stepped conversion elements 110 and a plurality of second semiconductor chips 102 with conversion elements 120 are connected in the manner illustrated.

In the case of the component 204 in FIG. 12, by way of example, the front-side contact 105 of a semiconductor chip 101 can constitute a p-type contact, and the front-side contact 105 of a semiconductor chip 102 that is electrically connected thereto can constitute an n-type contact. By contrast, the rear-side contact 106 of a semiconductor chip 101 can constitute an n-type contact, and the rear-side contact 106 of a semiconductor chip 102 that is connected thereto can constitute a p-type contact. For this purpose, for a semiconductor chip 101, for example, it is possible to employ the embodiment of a semiconductor chip 400 explained with reference to FIG. 11. For a semiconductor chip 102, it is possible to use the embodiment described below with reference to FIG. 13.

Figure 13:
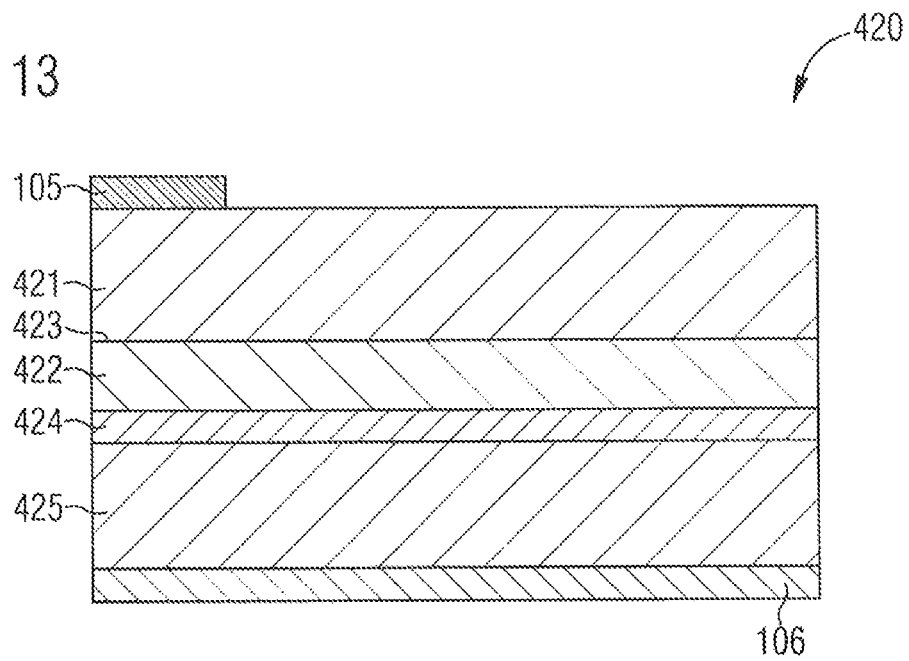
FIG. 13 shows a schematic lateral illustration of an optoelectronic semiconductor chip having a front-side and a rear-side contact.

FIG. 13 shows a schematic lateral illustration of a further semiconductor or LED chip 420. The semiconductor chip 420 has a layer sequence comprising a first semiconductor layer 421, a second semiconductor layer 422 and, present therebetween, an active zone 423 for generating radiation. The two semiconductor layers 421, 422 have different conductivities. On the front side, a metallic front-side contact 105 is arranged at the margin on the layer sequence or on the semiconductor layer 421. The layer sequence is furthermore connected via an intermediate layer 424 to a conductive carrier substrate 425, on which a metallic rear-side contact 106 is arranged at the rear side. A conversion element (not illustrated) can be adhesively bonded onto the semiconductor layer 421 at the front side.

In the case of the semiconductor chip 420, the front-side contact 105 makes contact with the first semiconductor layer 421. The rear-side contact 106 is electrically connected to the second semiconductor layer 422 via the carrier substrate 425 and the intermediate layer 424. By way of example, the first semiconductor layer 421 can be n-conducting and the second semiconductor layer 422 can be p-conducting, such that the front-side contact 105 as indicated above with reference to the component 204 from FIG. 12 constitutes an n-type contact, and the rear-side contact 106 constitutes a p-type contact.

The chip construction shown in FIG. 13 can be provided in the same way for the semiconductor chips 101, 102 connected in series in accordance with FIG. 10 (i.e., for all chips 101, 102).

Figure 14:
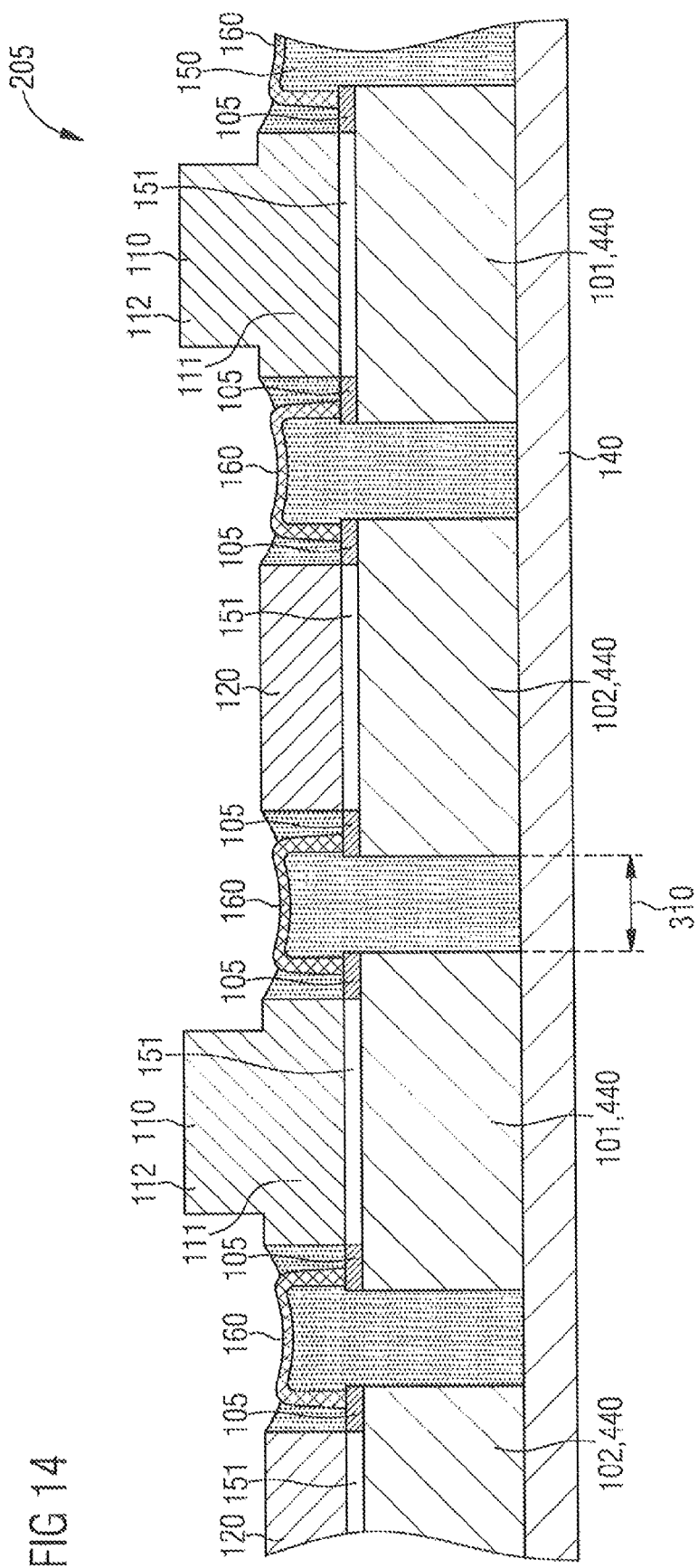
FIG. 14 shows a schematic lateral illustration of an optoelectronic component comprising semiconductor chips having two front-side contacts, wherein front-side contacts of semiconductor chips are electrically connected.

FIG. 14 shows an excerpt from a further optoelectronic component 205 comprising series-connected optoelectronic semiconductor chips 101, 102 and conversion elements 110, 120 arranged thereon. The semiconductor chips 101, 102 have in each case two metallic front-side contacts 105 arranged at opposite marginal sides, and therefore no rear-side contact. The front-side contacts 105 of the semiconductor chips 101, 102 arranged alongside one another are electrically connected via contact structures 160. In this case, at least the semiconductor chips 101, 102 shown in FIG. 14 can face one another with the chip regions having the front-side contacts 105. The contact structures 160 are arranged on the insulation material 150 and partly embedded into the insulation material 150, and therefore extend to the relevant front-side contacts 105. The electrical connection shown can be continued toward further semiconductor chips 101, 102 (not illustrated).

In the case of the component 205, the semiconductor chips 101, 102 are only mechanically connected to the carrier 140. In this configuration, the mechanical connection can be produced, for example, likewise using a solder. In this case, the semiconductor chips 101, 102 and the carrier 140 can have metallic layers which are coordinated with one another and which are connected by means of the solder (not illustrated). In the case of the semiconductor chips 101, 102, said layers can be provided on the rear side. Furthermore, the carrier 140 can be embodied substantially in the form of a heat sink.

The semiconductor chips 101, 102 of the component 205 can be positioned at relatively small distances 310 from one another on the carrier 140. The distances 310 can be fifty micrometers, for example. Furthermore, the electrical series connection shown in FIG. 14 can be present not just alternately in each case between a first and second semiconductor chip 101, 102. It is also possible to connect a plurality of first semiconductor chips 101 with stepped conversion elements 110 and a plurality of second semiconductor chips 102 with conversion elements 120 in the manner illustrated.

In the case of the semiconductor chips 101, 102 of the component 205, in each case one contact 105 constitutes a p-type contact and the other contact 105 constitutes an n-type contact. For such a configuration, the semiconductor chips 101, 102 can be embodied in accordance with the embodiment described below with reference to FIG. 15.

Figure 15:
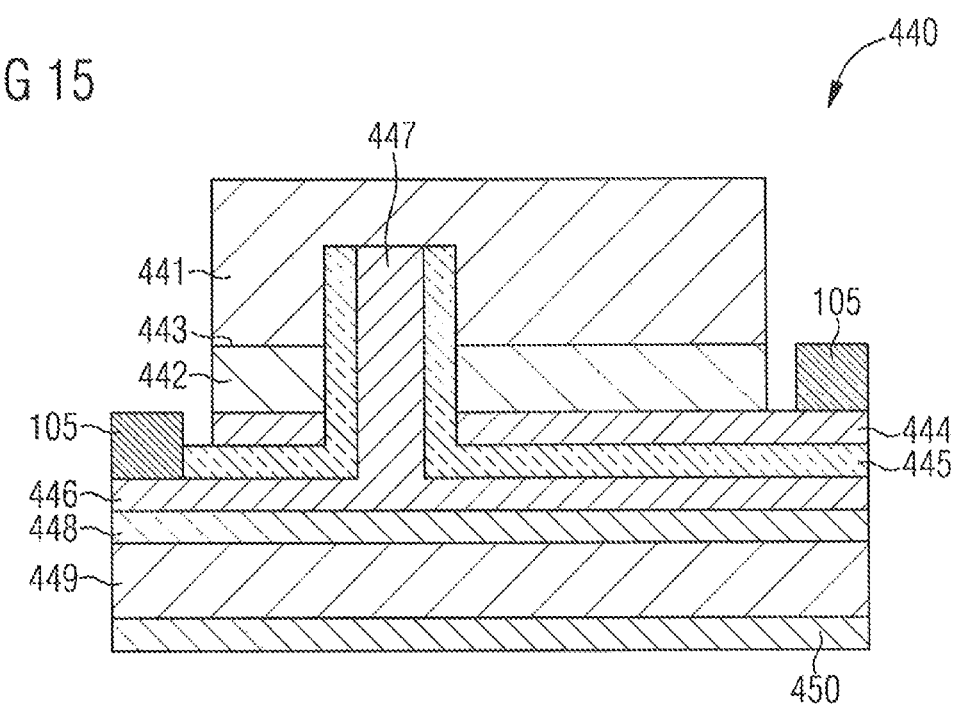
FIG. 15 shows a schematic lateral illustration of an optoelectronic semiconductor chip having two front-side contacts and a plated-through hole.

FIG. 15 shows a schematic lateral illustration of a further semiconductor or LED chip 440. The semiconductor chip 440 has a semiconductor body with a layer sequence comprising a first semiconductor layer 441, a second semiconductor layer 442 and, present therebetween, an active zone 443 for generating radiation. The two semiconductor layers 441, 442 have different conductivities or dopings. The semiconductor body is arranged on a conductive current spreading layer 444, on which a metallic front-side contact 105 is arranged laterally with respect to the semiconductor body (on the right in FIG. 15). A conversion element (not illustrated) can be adhesively bonded onto the semiconductor body or onto the semiconductor layer 441 at the front side.

The semiconductor chip 440 furthermore has a through contact 447. A cutout extending vertically through the current spreading layer 444, the semiconductor layer 442, the active zone 443 and into the semiconductor layer 441 is formed for the through contact 447, said cutout being filled at the margin with an insulation layer 445 and with a conductive layer 446 surrounded by the insulation layer 445. The conductive layer 446 makes contact with the semiconductor layer 441. Outside the through contact 447, the current spreading layer 444, the insulation layer 445 and the conductive layer 446 are present one above another in the form of a layer stack. A further metallic front-side contact 105 is arranged at the margin on a partial region of the conductive layer 446 (on the left in FIG. 15). The conductive layer 446 is furthermore connected to an insulating carrier substrate 449 via a connection layer 448. A metallic layer 450 is arranged on the carrier substrate 449 at the rear side and can be used for connection to a metallic layer of a carrier 140, as described above. The semiconductor chip 440 can be embodied with a plurality of such through contacts 447.

In the case of the semiconductor chip 440, the right front-side contact 105 is electrically connected to the second semiconductor layer 442 via the current spreading layer 444. The other, left front-side contact 105 is electrically connected to the first semiconductor layer 441 via the conductive layer 446 and the through contact(s) 447. By way of example, the second semiconductor layer 442 can be p-conducting, such that the right front-side contact 105 constitutes a p-type contact. By contrast, the first semiconductor layer 441 can be n-conducting, such that the other front-side contact 105 constitutes an n-type contact.

As was indicated above, an optoelectronic component can comprise a plurality of semiconductor chips 101, 102, wherein the semiconductor chips 101, 102 can be arranged in a suitably distributed manner on a carrier 140. In this case, the semiconductor chips 101, 102 can be positioned relatively closely to one another, as a result of which a high luminance and, with regard to the mixing of light radiations in different spectral ranges, in particular—as described above—of mint-colored and red light radiation to form a white or warm-white light radiation, a high homogeneity of the resulting light radiation can be obtained.

For illustration purposes, FIG. 16 shows a schematic plan view illustration of one possible or exemplary arrangement of semiconductor chips 101, 102 and conversion elements 110, 120 arranged thereon with and without a stepped form of an optoelectronic component 206. The semiconductor chips 101, 102 have in each case an individual front-side contact 105 at the margin or at a corner. In the case of a configuration as a white light source, by way of example, the light emitting units 101, 110 can be designed for generating a mint-colored light radiation, and the light emitting units 102, 120 can be designed for generating a red light radiation (or vice versa).

In the case of the component 206, electrical contacting (not shown) of semiconductor chips 101, 102 can be realized on the basis of the approaches described above, for example, in a manner corresponding to FIG. 10. In this case, by way of example, all the semiconductor chips 101, 102 can be connected in series. Alternatively, by way of example, consideration can be given to providing a plurality of separate series connections of semiconductor chips 101, 102. With regard to the electrical contacting, provision can furthermore be made for orienting the individual semiconductor chips 101, 102 in a departure from FIG. 16 in a different manner with the front-side contacts 105.

On the basis of the chip arrangement shown in FIG. 16 it furthermore becomes clear that the conversion elements 110, 120 arranged on the semiconductor chips 101, 102—as described above—have lateral cutouts or indentations coordinated with the front-side contacts 105 of the semiconductor chips 101, 102. As a result, the front-side contacts 105 are freely accessible for the formation of contact structures 160 extending to the front-side contacts 105.

With regard to a stepped conversion element 110, the possible form thereof becomes clear with reference to the enlarged plan view illustration of a semiconductor chip 101 shown in FIG. 17. The conversion element 110 has the first section 111 projecting laterally beyond the second section 112. The stepped form, and thus the two edges or edge structures 115, 116, are present over the entire perimeter of the conversion element 110. In this case, the sections 111, 112 and edge structures 115, 116 have comparable geometries and contours in the plan view, including the cutout coordinated with the front-side contact 105.

For the case of semiconductor chips 101, 102 having two front-side contacts 105 (see, e.g., FIG. 14), the conversion elements 110, 120 used can correspondingly have two cutouts coordinated with the two front-side contacts 105 at the margin. In this case, as viewed from above, a substantially rectangular or square basic shape can likewise be present (not illustrated). In the case of a stepped conversion element 110, the sections 111, 112 and edge structures 115, 116 can have in the same way comparable geometries and contours in the plan view, including cutouts coordinated with the front-side contacts 105 (not illustrated).

An optoelectronic component can furthermore be realized with one or a plurality of additional optoelectronic semiconductor chips without conversion elements arranged thereon, such that the primary light radiation is not converted. With regard to a white light source, mint-colored, red and blue light radiations can be superimposed in this way. In order to prevent covering of a semiconductor chip without a conversion element, a transparent spacer is used on such a semiconductor chip. In the case of the component 206 in FIG. 16, by way of example, in the case of one of the semiconductor chips, for example, in the case of the semiconductor chip 102 present exactly in the center, such a spacer can be employed instead of the conversion element 120.

Figure 18:
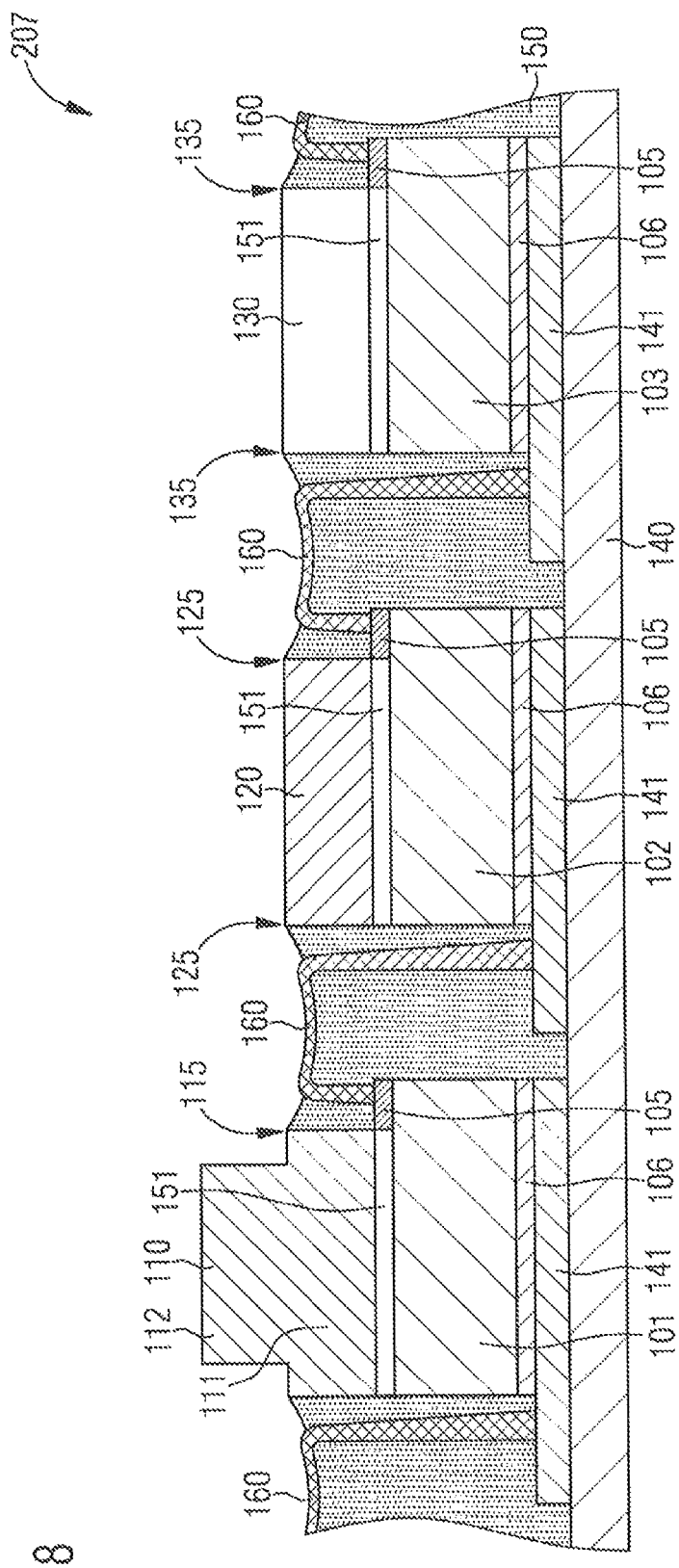
FIG. 18 shows a schematic lateral illustration of an optoelectronic component comprising semiconductor chips with conversion elements arranged on the semiconductor chips and a further semiconductor chip with a radiation-transmissive element arranged thereon.

For exemplary illustration, FIG. 18 shows an excerpt from a further optoelectronic component 207. The component 207 comprises semiconductor chips 101, 102 with conversion elements 110, 120 arranged thereon with and without a stepped form, and a further semiconductor chip 103 with a radiation-transmissive element 130 arranged thereon. The semiconductor chips 101, 102, 103 have in each case a front-side contact 105 and a rear-side contact 106. It is possible for the semiconductor chips 101, 102, 103 to have the same or a comparable construction and, as indicated in FIG. 18, the same height or thickness. By way of example, all the semiconductor chips 101, 102, 103 can have a construction corresponding to FIG. 11 or 13.

In a manner comparable to the conversion elements 110, 120, the radiation-transmissive element 130 is connected to the semiconductor chip 103 at the front side by means of a transparent adhesive 151 (silicone adhesive). Moreover, the element 130 has a form coordinated with the front-side contact 105 of the semiconductor chip 103 with a cutout present at the margin or at a corner. In the plan view, the element 130 can have the same lateral form as a second conversion element 120 (that is to say, for example, as shown in FIG. 16). Furthermore, the element 130, which can be formed from transparent clear silicone, for example, has a peripherally extending edge or edge structure 135 present on the front side at the margin.

In the case of the component 207, not only the edges 115, 125 of the conversion elements but also the edge 135 of the radiation-transmissive element 130 are situated at the same or substantially the same height. If appropriate, in a manner governed by tolerances, a small height offset of, for example, a few micrometers, for example, ten micrometers, can be present. The matching edge height again makes it possible that when the carrier 140 is potted with a white insulation material 150, the front-side contacts 105 of the semiconductor chips 101, 102, 103 being covered by the insulation material 150, the insulation material 150 is stopped at the edges 115, 125, 135, and the insulation material 150 therefore has the same or substantially the same thickness in the region of all the semiconductor chips 101, 102, 103. Covering both of the conversion element 120 and of the element 130 is avoided in this way.

With the use of semiconductor chips 101, 102, 103 having the same thickness, as shown in FIG. 18, the radiation-transmissive element 130 has the same thickness as the conversion element 120. Alternatively, however, a configuration of the component 207 with differently constructed semiconductor chips 101, 102, 103, and hence if appropriate different chip thicknesses, is also possible. By way of example, the semiconductor chips 101, 102 can be structurally identical, and the semiconductor chip 103 can have a construction deviating therefrom and a different thickness. In order still to bring about the described stopping effect during the potting of the carrier 140 in the case of such configurations as well, different thicknesses of the element 130 and of the conversion element 120 can therefore come into consideration in the case of different chip thicknesses.

FIG. 18 furthermore illustrates one possible contacting of the semiconductor chips 101, 102, 103. In this case, a structure corresponding to FIG. 10 is present, that is to say that the semiconductor chips 101, 102, 103 are arranged with the rear-side contacts 106 on contact areas 141 of the carrier 140, and front-side contacts 105 are connected to the contact areas 141 via contact structures 160. The electrical connection illustrated can be continued toward further semiconductor chips 101, 102, 103 (not illustrated). It is furthermore possible for a plurality of semiconductor chips 103 with elements 130 arranged thereon to be electrically connected in series.

The use of semiconductor chips 103 with radiation-transmissive elements 130 as described with reference to FIG. 18 can come into consideration analogously with other types of contacting, for example, the configurations shown in FIGS. 12 and 14. With reference to FIG. 14, a semiconductor chip 103 in this case has two front-side contacts 105. In the same way, a radiation-transmissive element 130 can have two cutouts coordinated therewith.

The embodiments explained with reference to the figures constitute preferred or exemplary embodiments of the invention. Besides the embodiments described and depicted, further embodiments are conceivable which can comprise further modifications or combinations of features. By way of example, other materials can be used instead of the materials indicated above, and numerical indications above concerning chip distances, thicknesses, etc. can be replaced by other indications.

It is possible for the optoelectronic semiconductor chips shown and described—in particular the exemplary embodiments shown in FIGS. 11, 13, 15—to comprise other or additional structures and layers (for example, additional mirror layers, etc.) and for conductivities inverted with respect to the indicated conductivities to be present instead of the latter. Furthermore, optoelectronic components can also be constructed with other embodiments of light emitting semiconductor or thin-film chips or embodiments deviating therefrom.

Instead of the partly curved form of the front-side contacts 105 as shown in FIGS. 16 and 17, other forms, such as a rectangular or square form, for example, can be considered. This is also possible in the case of configurations of semiconductor chips with two contacts 105 per chip. In a manner coordinated therewith, conversion elements 110, 120 and radiation-transmissive elements 130 can have other forms, in particular differently shaped cutouts, and hence other contours of edge structures 115, 116, 125, 135 in the plan view.

With regard to a contacting of semiconductor chips, the possibility is afforded of combining the approaches demonstrated with reference to FIGS. 10, 12, 14 if appropriate in one component.

Furthermore, it is possible for a contact structure 160 arranged on an insulation material 150, which contact structure makes contact with a front-side contact 105 of a semiconductor chip arranged at the end of a series connection, to be embodied in the form of a conductor track structure serving for contacting the relevant end of the series connection.

Furthermore, attention is drawn to the possibility of carrying out the formation of contact structures 160 on the basis of other methods rather than with the aid of an electroplating method. By way of example, the metallization process can comprise applying or filling a conductive or metallic paste or a solder.

A component can be embodied on the basis of the above approaches not only in the form of a white light source but also in the form of a light source for emitting a light radiation having a different color. Furthermore, the spectral ranges for primary and secondary radiations indicated above can be replaced by other spectral ranges. By way of example, consideration can be given to using semiconductor chips for generating a primary radiation in the ultraviolet spectral range. Moreover, conversion elements can be formed from different materials than those indicated above. One example of a conversion material for generating a yellow-orange light radiation is europium-doped CaSiAlON.

Furthermore, consideration can be given to constructing a component both with ceramic conversion elements and with conversion elements composed of particle-filled silicone. Moreover, attention is drawn to the possibility of forming a component having more than two different types of conversion elements, i.e., for generating more than two different secondary radiations or colors. In the case of such approaches, a stepped configuration of conversion elements can likewise achieve the result of preventing (lower) conversion elements from being covered with an insulation material during potting.

It is furthermore possible to provide a parallel connection in addition or as an alternative to a series connection of semiconductor chips. Moreover, if appropriate, consideration can be given to connecting to semiconductor chips such contact structures with the aid of which separate driving or energization of individual or a plurality of semiconductor chips is possible.

Instead of a white silicone, it is possible to employ some other reflective or white potting material. This can include a suitable polymer material such as an epoxy material, for example, which can likewise be filled with scattering particles.

Although the invention has been more specifically illustrated and described in detail by means of preferred or exemplary embodiments, nevertheless the invention is not restricted by the examples disclosed and other variations can be derived therefrom by the person skilled in the art, without departing from the scope of protection of the invention.

The invention claimed is:

1. An optoelectronic component comprising:
   a carrier;
   a first optoelectronic semiconductor chip arranged on the carrier;
   a first conversion element arranged on the first semiconductor chip and configured to convert a light radiation emitted by the first semiconductor chip, wherein the first conversion element is embodied in a stepped fashion and has a first section and a second section, wherein the first section projects laterally beyond the second section;
   a second optoelectronic semiconductor chip arranged on the carrier;
   a second conversion element arranged on the second semiconductor chip and configured to convert a light radiation emitted by the second semiconductor chip; and
   an insulation material arranged on the carrier, the insulation material surrounding the first and second semiconductor chips and the first and second conversion elements,
   wherein the first conversion element has an edge present at a front-side margin of the second section and an additional edge present at a front-side margin of the first section, and wherein the insulation material in a region of the first semiconductor chip stops at the additional edge.

2. The optoelectronic component according to claim 1, wherein the first and second conversion elements have different thicknesses.

3. The optoelectronic component according to claim 1, wherein a side surface of the second section is free of the insulation material.

4. The optoelectronic component according to claim 1, wherein the first section of the first conversion element projects laterally beyond the second section over the entire perimeter of the first conversion element.

5. The optoelectronic component according to claim 1, wherein the insulation material comprises white silicone.

6. The optoelectronic component according to claim 1, wherein the first and second semiconductor chips each have a front-side contact, and wherein the optoelectronic component comprises a contact structure arranged on the insulation material and extending to at least one front-side contact.

7. The optoelectronic component according to claim 1,
   wherein the first and second semiconductor chips are designed to generate the light radiation in a blue spectral range;
   wherein one of the first and second conversion elements is designed to convert part of the light radiation generated by one of the first and second semiconductor chips into a light radiation in a green spectral range; and
   wherein the other of the first and second conversion elements is designed to convert the light radiation generated by the other of the first and second semiconductor chips into a light radiation in a red spectral range.

8. The optoelectronic component according to claim 1, wherein the optoelectronic component comprises a plurality of first semiconductor chips and first conversion elements arranged on the carrier and/or a plurality of second semiconductor chips and second conversion elements arranged on the carrier.

9. The optoelectronic component according to claim 1, further comprising a further semiconductor chip arranged on the carrier and a radiation-transmissive element arranged on the further semiconductor chip.

10. The optoelectronic component according to claim 1, wherein the first and second conversion elements comprise ceramic conversion elements.

11. A method for producing an optoelectronic component according to claim 1, the method comprising:
   arranging the first and second optoelectronic semiconductor chips on a carrier;
   arranging the first conversion element on the first semiconductor chip, the first conversion element configured to convert the light radiation emitted by the first semiconductor chip, wherein the first conversion element arranged on the first semiconductor chip is embodied in a stepped fashion and has the first and second sections, wherein the first section projects laterally beyond the second section;

arranging the second conversion element on the second semiconductor chip, the second conversion element configured to convert the light radiation emitted by the second semiconductor chip; and applying an insulation material to the carrier in such a way that the insulation material surrounds the first and second semiconductor chips and the first and second conversion elements.

12. The method according to claim 11, wherein the first conversion element is produced from a starting element by a two-stage structuring method being carried out.

13. The method according to claim 11,
wherein the first and second semiconductor chips each have at least one front-side contact;
wherein insulation material applied to the carrier covers the front-side contacts;
wherein a cutout extending to a front-side contact is formed in the insulation material; and
wherein after the cutout has been formed a metallic material is applied to the insulation material to fill the cutout in order to form a contact structure.

14. An optoelectronic component comprising:
a carrier;
a first optoelectronic semiconductor chip arranged on the carrier;
a first conversion element arranged on the first semiconductor chip and configured to convert a light radiation emitted by the first semiconductor chip, wherein the first conversion element is embodied in a stepped fashion and has a first and a second section, wherein the first section projects laterally beyond the second section;
a second optoelectronic semiconductor chip arranged on the carrier;
a second conversion element arranged on the second semiconductor chip and configured to convert a light radiation emitted by the second semiconductor chip; and
an insulation material arranged on the carrier, the insulation material surrounding the first and second semiconductor chips and the first and second conversion elements, wherein the first and second semiconductor chips each have a front-side contact, and wherein the optoelectronic component comprises a contact structure arranged on the insulation material and extending to at least one front-side contact.

15. A method for producing an optoelectronic component comprising a carrier, a first optoelectronic semiconductor chip arranged on the carrier, a first conversion element arranged on the first semiconductor chip and configured to convert a light radiation emitted by the first semiconductor chip, wherein the first conversion element is embodied in a stepped fashion and has a first and a second section, wherein the first section projects laterally beyond the second section, a second optoelectronic semiconductor chip arranged on the carrier, a second conversion element arranged on the second semiconductor chip and configured to convert a light radiation emitted by the second semiconductor chip and an insulation material arranged on the carrier, the insulation material surrounding the first and second semiconductor chips and the first and second conversion elements, the method comprising:

arranging the first and second optoelectronic semiconductor chips on a carrier;

arranging the first conversion element on the first semiconductor chip, the first conversion element configured to convert the light radiation emitted by the first semiconductor chip, wherein the first conversion element arranged on the first semiconductor chip is embodied in a stepped fashion and has the first and second sections, and wherein the first section projects laterally beyond the second section;

arranging the second conversion element on the second semiconductor chip, the second conversion element configured to convert the light radiation emitted by the second semiconductor chip; and applying the insulation material to the carrier in such a way that the insulation material surrounds the first and second semiconductor chips and the first and second conversion elements, wherein the first and second semiconductor chips each have at least one front-side contact, wherein insulation material applied to the carrier covers the front-side contacts, wherein a cutout extending to a front-side contact is formed in the insulation material, and wherein after the cutout has been formed a metallic material is applied to the insulation material to fill the cutout in order to form a contact structure.

* * * * *